(12) United States Patent
Chen et al.

(10) Patent No.: US 11,619,883 B2
(45) Date of Patent: Apr. 4, 2023

(54) SNAPSHOT TYPE OVERLAY ERROR MEASURING DEVICE AND MEASURING METHOD

(71) Applicant: HUAZHONG UNIVERSITY OF SCIENCE AND TECHNOLOGY, Hubei (CN)

(72) Inventors: Xiuguo Chen, Hubei (CN); Shiyuan Liu, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 79 days.

(21) Appl. No.: 17/407,149

(22) Filed: Aug. 19, 2021

(65) Prior Publication Data
US 2022/0350261 A1   Nov. 3, 2022

(30) Foreign Application Priority Data
Apr. 29, 2021   (CN) .......................... 202110470725.7

(51) Int. Cl.
*G03F 7/20* (2006.01)
*G01B 11/27* (2006.01)
(Continued)

(52) U.S. Cl.
CPC .......... *G03F 7/70633* (2013.01); *G01B 11/14* (2013.01); *G01B 11/272* (2013.01);
(Continued)

(58) Field of Classification Search
CPC ......... G01B 11/14; G01B 11/26; G01B 11/27; G01B 11/272; G03F 7/70616;
(Continued)

(56) References Cited

U.S. PATENT DOCUMENTS

| 8,525,993 | B2 * | 9/2013 | Rabello | ................ G01N 21/211 356/369 |
| 10,345,568 | B2 * | 7/2019 | Chen | .................. G02B 21/0092 |

(Continued)

FOREIGN PATENT DOCUMENTS

| CN | 103049605 A | * | 4/2013 |
| CN | 103134592 A | * | 6/2013 |

(Continued)

*Primary Examiner* — Gordon J Stock, Jr.
(74) *Attorney, Agent, or Firm* — JCIPRNET (57) ABSTRACT

The disclosure belongs to the technical field related to on-line measurement in manufacture of integrated circuit, which discloses a snapshot type overlay error measuring device and a measuring method thereof. The measuring method includes: the detection light is subjected to polarization and retardation in sequence to obtain measurement spectrum; Fourier analysis is performed on the measurement spectrum to obtain the frequency-domain signal of the measurement spectrum, and sub-channel frequency-domain analysis is performed on the frequency-domain signal to obtain the linear combination of the non-diagonal Mueller matrix elements of the overlay error sample to be tested; the linear combination of the non-diagonal Mueller matrix elements are processed to obtain the overlay error of the overlay sample under test. This disclosure does not need to measure all 16 Mueller matrix elements, the measurement is carried out on only a few non-diagonal Mueller matrix elements which are sensitive to overlay error.

10 Claims, 3 Drawing Sheets

(51) Int. Cl.
*G01N 21/21* (2006.01)
*G01B 11/14* (2006.01)
*G02B 5/30* (2006.01)

(52) U.S. Cl.
CPC ........... *G01N 21/21* (2013.01); *G03F 7/7085* (2013.01); *G02B 5/3083* (2013.01)

(58) Field of Classification Search
CPC . G03F 7/70633; G03F 7/7085; G02B 5/3083; G01J 1/00; G01J 1/02; G01J 1/04; G01N 21/211
See application file for complete search history.

(56) References Cited

U.S. PATENT DOCUMENTS

| | | | |
|---|---|---|---|
| 10,634,560 B2 * | 4/2020 | Abdulhalim | G02B 27/286 |
| 10,739,251 B2 * | 8/2020 | Jiang | G02B 5/3025 |
| 2012/0176618 A1 * | 7/2012 | Vagos | G01N 21/23 |
| | | | 356/369 |
| 2015/0308817 A1 * | 10/2015 | Li | G03F 7/70466 |
| | | | 356/401 |
| 2019/0094711 A1 * | 3/2019 | Atkins | G01N 21/211 |

FOREIGN PATENT DOCUMENTS

| | | | | |
|---|---|---|---|---|
| CN | 109580551 A | * | 4/2019 | ................ G01J 1/42 |
| CN | 110347017 A | * | 10/2019 | |
| CN | 112179851 A | * | 1/2021 | ........... G01N 21/211 |
| CN | 112198763 | | 1/2021 | |

\* cited by examiner

SNAPSHOT TYPE OVERLAY ERROR MEASURING DEVICE AND MEASURING METHOD

CROSS REFERENCE TO RELATED APPLICATION

This application claims the priority benefit of China patent application serial no. 202110470725.7 filed Apr. 29, 2021. The entirety of the above-mentioned patent application is hereby incorporated by reference herein and made a part of the specification.

BACKGROUND

Field of the Disclosure

The disclosure belongs to the technical field related to in-line measurement in the manufacturing of integrated circuits, and more specifically, relates to a snapshot type overlay error measuring device and a measuring method thereof.

Description of Related Art

Lithography is a very important process in the manufacturing of integrated circuits (IC). Overlay error refers to the alignment error between the current layer (the pattern remaining on the photoresist after exposure and development) and the reference layer (the existing pattern on the wafer) during exposure, that is, the relative deviation amount generated between the reference layer and designed position of the current layer. Overlay error, resolution and yield are the three major performance indicators of lithography tools. The rapid measurement and accurate evaluation of lithography tools are the key to ensuring the optimization of operating parameters of lithography tools and control of process yield. In the semiconductor manufacturing process, a specific overlay error measuring device must be used to accurately measure the overlay error, calculate the required correction amount for the overlay error, and feed the correction amount back to the alignment control system of the lithography machine to correct the overlay error. In actual applications, in order to ensure that the circuits designed between the upper and lower layers can be reliably connected, it is usually required that the overlay error between the current layer and the previous layer in the key lithography layer must be less than ⅓-⅕ of the characteristic line width of the pattern. Currently, the international semiconductor technology node has been reduced to the 7 nm node. In the future, the overlay error of the key lithography layer will be reduced to the sub-nanometer level, which sets extremely high requirements on overlay error measuring technology.

The paper "Device based in-chip critical dimension and overlay metrology" (Opt. Express 17, 21336-21343 (2009)) proposes to use the Mueller matrix corresponding to zero-order diffracted light to measure overlay error. Specifically, a linear relationship between the linear combination $\Delta M$ ($\Delta M$ can be $M_{13}+M_{31}$, $M_{23}+M_{32}$, $M_{41}-M_{14}$ or $M_{42}-M_{24}$) of the non-diagonal Mueller matrix elements corresponding to the zero-order diffracted light and overlay error OV can be adopted to solve the overlay error, namely:

$$\Delta M = K \times OV \quad (a)$$

Based on the formula (a), the deviations of +D and −D are preset on the two overlay error marks respectively, so that the total overlay error in the two marks is (OV+D) and (OV−D) respectively, and combination $\Delta M^+$ and $\Delta M^-$ of non-diagonal Mueller matrix elements corresponding to the zero-order diffracted light of the two marks are measured, and the overlay error OV can be obtained by formulas (b)-(d):

$$\Delta M^+ = K \times (OV + D) \quad (b)$$

$$\Delta M^- = K \times (OV - D) \quad (c)$$

$$OV = D \times \frac{\Delta M^+ + \Delta M^-}{\Delta M^+ - \Delta M^-} \quad (d)$$

The method of using formulas (a)-(b) for overlay error measurement is also called empirical diffraction-based overlay (eDBO) measuring method.

The key to using Mueller matrix for overlay error measurement lies in how to quickly and accurately measure the Mueller matrix elements. The current methods for realizing the measurement of the Mueller matrix mainly include the dual rotating-compensator-type Mueller matrix measurement principle, the four-liquid crystal phase retarder-type Mueller matrix measurement principle and the four-photoelastic modulator-type Mueller matrix measurement principle. Among the above methods, the four-liquid crystal phase retarder-type Mueller matrix measurement or four-photoelastic modulator-type Mueller matrix measurement is mostly used for single-wavelength, multi-wavelength or wide-spectrum Mueller matrix. Typically, the required measurement time is a few minutes or even around ten minutes. The dual rotating-compensator-type Mueller matrix measurement can realize the fast measurement (second level) of the wide-spectrum Mueller matrix, but it is still difficult to meet the requirements of overlay error measurement speed. China patent publication no. CN112198763A discloses an overlay error measuring device and a measuring method and an optimization method. In the patent publication mentioned above, there are two phase retarders composed of multi-order waveplates at the polarization state generator (PSG) arm end and the polarization state analyzer (PSA) arm end in the optical path. The four phase retarders neither rotate, nor are controlled by an external voltage. By selecting a suitable thickness ratio, all 16 Mueller matrix elements of the sample to be tested can be modulated into the channeled spectrum data, and the measured channeled spectrum data can be subjected to Fourier analysis to obtain the Mueller matrix of the sample to be tested, which can realize faster Mueller matrix measurement (on the level of milliseconds). However, this kind of snapshot Mueller matrix measurement process usually involves more than a dozen or even dozens of carrier frequency channels. In order to avoid the problem of mutual crosstalk between different carrier frequency channels, there are extremely high requirements on the spectral resolution of the spectrometer, and it is difficult to achieve measurement of the Mueller matrix with the wide spectral range. Typically, the method can only be adopted for measurement of infrared narrow-band Mueller matrix. In fact, wide-spectrum measurement plays a very important role in improving the sensitivity of overlay error measurement and solving the influence of process deviation on the accuracy of overlay error measurement. Therefore, there is an urgent need to design a fast overlay error measuring device and method applicable for a wide spectral range.

SUMMARY OF THE DISCLOSURE

In view of the above defects or requirements for improvement of the related art, the disclosure provides a snapshot type overlay error measuring device and a measuring method thereof. This disclosure does not need to measure all 16 Mueller matrix elements, the measurement is carried out on only a few non-diagonal Mueller matrix elements which are sensitive to overlay error. Only a smaller number of carrier frequency channels are involved, and the disclosure can be used for rapid measurement of Mueller matrix elements within a wide spectral range ranging from visible light band to infrared band.

In order to achieve the above purpose, according to one aspect of the disclosure, a snapshot type overlay error measuring method is provided. The measuring method includes: S1, the detection light being subjected to a polarizer and a first phase retarder and converging on the surface of the overlay sample to be measured to obtain zero-order diffracted light, and then the zero-order diffracted light being subjected to a second phase retarder and the analyzer in sequence to obtain a measurement spectrum; S2, Fourier analysis being performed on the measurement spectrum to obtain the frequency-domain signal of the measurement spectrum, and sub-channel frequency-domain analysis being performed on the frequency-domain signal to obtain the linear combination of the non-diagonal Mueller matrix elements of the overlay sample to be tested. Specifically, the following system model is used to obtain the non-diagonal Mueller matrix elements of the overlay sample to be tested.

$$S_{out}=[M_A R(\alpha_2)] \cdot [R(-\beta_2) M_R(\delta_2) R(\beta_2)] \cdot M_S \cdot [R(-\beta_1) M_R(\delta_1) R(\beta_1)] \cdot [R(-\alpha_1) M_P] \cdot S_{in}$$

In the formula, $S_{out}$ is the Stokes vector corresponding to the emitted light, $M_A$ is the Mueller matrix corresponding to the analyzer, $M_P$ is the Mueller matrix corresponding to the polarizer, $R(*)$ represents the Mueller rotation matrix when the rotation angle is $*$, $\alpha_1$ is the azimuth of the light transmission axis for the polarizer, $\alpha_2$ is the azimuth of the light transmission axis for the analyzer; $\beta_1$ is the azimuth of the fast axis during the first phase retarder, and $\beta_2$ is the azimuth of the fast axis during the second phase retarder, $M_R(\delta_1)$ is the Mueller matrix corresponding to the first phase retarder, $M_R(\delta_2)$ is the Mueller matrix corresponding to the second phase retarder, $M_S$ is the Mueller matrix corresponding to the sample under test, and $S_{in}$ is the Stokes vector corresponding to the incident light; S3, the linear combination of the non-diagonal Mueller matrix elements being processed to obtain the overlay error of the overlay sample under test.

Preferably, the azimuth of the light transmission axis during the polarizer is 0°, the azimuth of the fast axis during the first phase retarder is ±45°, the azimuth of the fast axis during the second phase retarder is 0°, and the azimuth of the light transmission axis during the analyzer is ∓45°; or the azimuth of the light transmission axis during the polarizer is ±45°, the azimuth of the fast axis during the first phase retarder is 0°, the azimuth of the fast axis during the second phase retarder is ∓45°, and the azimuth of the light transmission axis during the analyzer is 0°; or the azimuth of the light transmission axis during the polarizer is 0°, the azimuth of the fast axis during the first phase retarder is ±45°, the azimuth of the fast axis during the second phase retarder is ±45°, and the azimuth of the light transmission axis during the analyzer is 0°; or the azimuth of the light transmission axis during the polarizer is ±45°, the azimuth of the fast axis during the first phase retarder is 0°, the azimuth of the fast axis during the second phase retarder is 0°, and the azimuth of the light transmission axis during the analyzer is ±45°.

Preferably, in step S3, the non-diagonal Mueller matrix elements are processed by the empirical diffraction-based overlay (eDBO) method or the machine learning method to obtain the overlay error of the overlay sample under test.

Another aspect of the disclosure provides a measuring device for realizing the above-mentioned snapshot type overlay error measuring method. The measuring device includes a PSG arm and a PSA arm. The PSG arm includes a polarizer, a first phase retarder, and a first lens group arranged in sequence along the optical path. The PSA arm and the PSG arm are arranged symmetrically along the normal line of the surface of the overlay sample to be tested. The PSA arm includes a second lens group, a second phase retarder and an analyzer arranged in sequence along the optical path.

Preferably, the azimuth of the light transmission axis of the polarizer is 0°, the azimuth of the fast axis of the first phase retarder is ±45°, the azimuth of the fast axis of the second phase retarder is 0°, and the azimuth of the light transmission axis of the analyzer is ∓45°; or the azimuth of the light transmission axis of the polarizer is ±45°, the azimuth of the fast axis of the first phase retarder is 0°, the azimuth of the fast axis of the second phase retarder is ∓45°, and the azimuth of the light transmission axis of the analyzer is 0°; or the azimuth of the light transmission axis of the polarizer is 0°, the azimuth of the fast axis of the first phase retarder is ±45°, the azimuth of the fast axis of the second phase retarder is ±45°, and the azimuth of the light transmission axis of the analyzer is 0°; or the azimuth of the light transmission axis of the polarizer is ±45°, the azimuth of the fast axis of the first phase retarder is 0°, the azimuth of the fast axis of the second phase retarder is 0°, and the azimuth of the light transmission axis of the analyzer is ±45°.

Preferably, the device further includes a detection system and a data processing system. The detection system is arranged on the optical path of the PSA arm, and the detection system converges the beam demodulated by the PSA arm and transmits the beam to the data processing system. The data processing system converts the light intensity of the beam into Mueller matrix elements, and obtains an overlay error according to the Mueller matrix elements.

Preferably, the thickness ratio of the first phase retarder and the second phase retarder is 1:1 or 1:3.

Preferably, the first phase retarder and the second phase retarder are multi-order waveplates made of birefringent crystals.

In summary, by comparing the known technologies with the above technical solutions conceived by the disclosure, a snapshot type overlay error measuring device and a measuring method thereof provided by the disclosure have the following advantageous effect:

1. The system model in this disclosure only needs to learn the azimuth of polarization and phase retardation and the Mueller matrix, and only need to learn several non-diagonal Mueller matrix elements that are sensitive to overlay error (including: $M_{13}$, $M_{31}$, $M_{23}$, $M_{32}$, $M_{41}$, $M_{14}$, $M_{42}$ or $M_{24}$) or measure the linear combination of non-diagonal Mueller matrix elements (including: $M_{13}+M_{31}$, $M_{23}+M_{32}$, $M_{41}-M_{14}$ or $M_{42}-M_{24}$) to realize the measurement of overlay error. The disclosure avoids the problem of mutual crosstalk between carrier frequency channels, thereby realizing the measurement of Mueller matrix elements within a wider spectral range.

2. The combination of characteristics of the azimuth of the light transmission axis during the polarizer, the azimuth of fast axis during the first phase retarder, the azimuth of fast axis during the second phase retarder, and the azimuth of the light transmission axis during the analyzer makes it easy to obtain several non-diagonal Mueller matrix elements that are sensitive to overlay error.

3. In the disclosure, there is only one phase retarder on the PSG arm and PSA arm of the overlay error measuring device, which effectively reduces the number of carrier frequency channels. On the one hand, the disclosure avoids the problem of mutual crosstalk between carrier frequency channels, and on the other hand, the disclosure can achieve measurement of Mueller matrix elements in a wider spectral range.

4. The overlay error measuring device and a measuring method thereof in the disclosure can obtain the overlay error characterization quantity by measuring the zero-order diffracted light of the overlay mark, without receiving positive and negative first-order diffracted light, and can effectively solve the problem that the overlay period is limited in conventional technologies.

5. The overlay error measuring device of the disclosure can quickly obtain the Mueller matrix of the overlay sample to be tested. The measurement time depends only on the detection time of the detection system and the processing time of the data processing system, which effectively solves the problem of long time required for Mueller matrix ellipsometric measurement in conventional technologies.

6. The overlay error measuring device in the disclosure does not include a moving device, which can avoid the movement error caused by the moving device in the conventional ellipsometry measurement process.

7. The thickness ratio of the first phase retarder and the second phase retarder is preferably 1:1 or 1:3, under which a clear overlay error can be obtained.

8. The disclosure performs overlay error measurement based on incident light and reflected light. Therefore, the disclosure not only can be used for overlay error measurement based on overlay marks, but also can directly measure the device area to obtain the overlay error of the device area.

9. The device of the disclosure has an unrestricted overlay mark cycle, fast measurement speed, and the measurement result is not affected by the interference of the moving device on the measurement signal, and can be applied to overlay error measurement based on the overlay mark in the scribe groove area and overlay error measurement based on the device itself.

BRIEF DESCRIPTION OF THE DRAWINGS

In the drawings, the same reference numerals are used to denote the same elements or structures.

DESCRIPTION OF EMBODIMENTS

In order to make the purpose, technical solutions, and advantages of the disclosure clearer, the following further describes the disclosure in detail with reference to the accompanying drawings and embodiments. It should be understood that the specific embodiments described here are only used to explain the disclosure, but not to limit the disclosure. In addition, the technical features involved in the various embodiments of the disclosure described below can be combined with each other as long as they do not conflict with each other.

Figure 1:
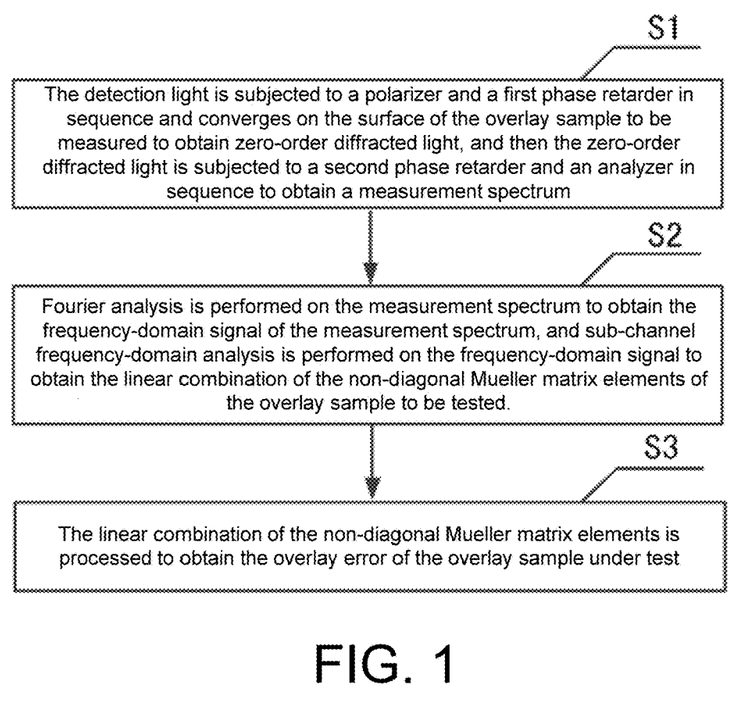
FIG. 1 schematically shows a step diagram of a measuring method of an overlay error measuring device embodied in the embodiment.

Referring to FIG. 1, the disclosure provides a snapshot type overlay error measuring method. The measuring method includes the following steps S1 to S3.

S1: The detection light is subjected to the polarizer and the first phase retarder and converges on the surface of the overlay sample to be measured to obtain zero-order diffracted light, and then the zero-order diffracted light is subjected to a second phase retarder and the analyzer in sequence to obtain a measurement spectrum.

S2: Fourier analysis is performed on the measurement spectrum to obtain the frequency-domain signal of the measurement spectrum, and sub-channel frequency-domain analysis is performed on the frequency-domain signal to obtain the linear combination of the non-diagonal Mueller matrix elements of the overlay sample to be tested. Specifically, the following system model is used to obtain the non-diagonal Mueller matrix elements of the overlay sample to be tested:

$$S_{out}=[M_A R(\alpha_2)]\cdot[R(-\beta_2)M_R(\delta_2)R(\beta_2)]\cdot M_S\cdot[R(-\beta_1)M_R(\delta_1)R(\beta_1)]\cdot[R(-\alpha_1)M_P]\cdot S_{in} \quad (1)$$

In the formula, $S_{out}$ is the Stokes vector corresponding to the emitted light, $M_A$ is the Mueller matrix corresponding to the analyzer, $M_P$ is the Mueller matrix corresponding to the polarizer, $R(*)$ represents the Mueller rotation matrix when the rotation angle is $*$, $\alpha_1$ is the azimuth of the light transmission axis for the polarizer, $\alpha_2$ is the azimuth of the light transmission axis for the analyzer; $\beta_1$ is the azimuth of the fast axis during the first phase retarder, and $\beta_2$ is the azimuth of the fast axis during the second phase retarder, $M_R(\delta_1)$ is the Mueller matrix corresponding to the first phase retarder, $M_R(\delta_2)$ is the Mueller matrix corresponding to the second phase retarder, $M_S$ is the Mueller matrix corresponding to the sample under test, and $S_{in}$ is the Stokes vector corresponding to the incident light.

S3: The linear combination of the non-diagonal Mueller matrix elements is processed to obtain the overlay error of the overlay sample under test.

In this embodiment, $S_{in}=[I_{in}, 0, 0, 0]^T$ is the Stokes vector corresponding to the incident light, $I_{in}$ is the incident light intensity, and the superscript "T" represents the matrix transposition; $M_P$ and $M_A$ are respectively the Mueller matrix corresponding to the polarizer and the Mueller matrix corresponding to the analyzer.

$$M_A = M_P = \frac{1}{2}\begin{bmatrix} 1 & 1 & 0 & 0 \\ 1 & 1 & 0 & 0 \\ 0 & 0 & 0 & 0 \\ 0 & 0 & 0 & 0 \end{bmatrix} \quad (2)$$

$M_R(\delta_1)$ and $M_R(\delta_2)$ are respectively the Mueller matrix corresponding to the first phase retarder and the Mueller matrix corresponding to the second phase retarder.

$$M_R(\delta_i) = \begin{bmatrix} 1 & 0 & 0 & 0 \\ 0 & 1 & 0 & 0 \\ 0 & 0 & \cos\delta_i & \sin\delta_i \\ 0 & 0 & -\sin\delta_i & \cos\delta_i \end{bmatrix}, (i = 1, 2) \quad (3)$$

In the formula, $\delta_1$ and $\delta_2$ are respectively the phase retardation of the first phase retarder and the phase retardation of the second phase retarder, and $\delta_i = 2\pi B_i(\sigma) t_i \sigma$ (i=1, 2), where, $B_i(\sigma)$ and $t_i$ are respectively the birefringence and thickness of the multi-order waveplate, and $\sigma$ is the wavenumber (that is, the reciprocal of the wavelength $\lambda$).

$M_S$ is the Mueller matrix corresponding to the sample to be tested:

$$M_S = \begin{bmatrix} M_{11} & M_{12} & M_{13} & M_{14} \\ M_{21} & M_{22} & M_{23} & M_{24} \\ M_{31} & M_{32} & M_{33} & M_{34} \\ M_{41} & M_{42} & M_{43} & M_{44} \end{bmatrix} \quad (4)$$

$R(\gamma)$ represents the Mueller rotation matrix with the rotation angle $\gamma$:

$$R(\gamma) = \begin{bmatrix} 1 & 0 & 0 & 0 \\ 0 & \cos 2\alpha & -\sin 2\alpha & 0 \\ 0 & \sin 2\alpha & \cos 2\alpha & 0 \\ 0 & 0 & 0 & 1 \end{bmatrix} \quad (5)$$

In the formula, $\gamma = \alpha_1, \alpha_2, \beta_1, \beta_2$; $\alpha_1$ and $\alpha_2$ are respectively the azimuth of the light transmission axis during the polarizer and the azimuth of the light transmission axis during the analyzer, and $\beta_1$ and $\beta_2$ are respectively the azimuth of the fast axis during the first phase retarder and the azimuth of the fast axis during the second phase retarder.

Taking the following as an example, in which the azimuth of the light transmission axis during the polarizer is 0°, the azimuth of the fast axis during the first phase retarder is 45°, the azimuth of the fast axis during the second phase retarder is 45°, and the azimuth of the light transmission during the analyzer is 0°, that is: $\alpha_1 = \alpha_2 = 0°$, $\beta_1 = \beta_2 = 45°$. If the devices used in the first phase retarder and the second phase retarder are made of multi-order waveplates (i.e., $B_1(\sigma) = B_2(\sigma)$, abbreviated as $B(\sigma)$) fabricated by using the same birefringent crystal material, and the two multi-order waveplates have the same thickness (that is, $t_1 = t_2$, abbreviated as t), then the phase retardation amount of the two multi-order waveplates subjected to phase retardation is $\delta_1 = \delta_2$. For convenience, the phase retardation of the first phase retarder and the second phase retarder is indicated as $\delta = 2\pi B(\sigma) t\sigma$. Formulas (2) to (3) are substituted into formula (1), by expanding the formula, the light intensity $I_{out}$ corresponding to the emitted light beam (that is, the first element of the emitted light corresponding to the Stokes vector $S_{out}$) can be obtained:

$$I_{out} = \tfrac{1}{4} I_{in} [M_{11} + \tfrac{1}{2}(M_{22} - M_{44}) + (M_{41} - M_{14})\sin\delta + (M_{12} + M_{21})\cos\delta \tfrac{1}{2}(M_{42} - M_{24})\sin 2\delta + \tfrac{1}{2}(M_{22} + M_{44})\cos 2\delta] \quad (6)$$

By using Euler's formula, formula (6) can be transformed into:

$$I_{out} = \tfrac{1}{4} I_{in} \{ M_{11} + \tfrac{1}{2}(M_{22} - M_{44}) + \tfrac{1}{2}[(M_{12}+M_{21}) - i(M_{41}-M_{14})]e^{i\delta} \tfrac{1}{2}[(M_{12}+M_{21}) + i(M_{41}-M_{14})]e^{-\delta} + \tfrac{1}{4}[(M_{22}+M_{44}) - i(M_{42}-M_{24})]e^{i2\delta} \tfrac{1}{4}[(M_{22}+M_{44}) + i(M_{42}-M_{24})]e^{-i2\delta} \} \quad (7)$$

It should be pointed out that in formulas (6) and (7), $I_{in}$ and $M_{ij}$ (i, j=1, 2, 3, 4) are functions of wavenumber $\sigma$. Based on formula (7), the quantities to be measured, $M_{41} - M_{14}$ and $M_{42} - M_{24}$, are modulated into the carrier frequency channels $f_{\pm 1} = \pm B(\sigma)t$ and $f_{\pm 2} = \pm 2B(\sigma)t$ respectively. By performing Fourier transform on formula (7), and then applying band-pass filtering on the above-mentioned carrier frequency channel, the quantities to be measured can be obtained.

In this embodiment, it is preferable to obtain the overlay error of the overlay sample to be tested through the eDBO method or the machine learning method according to the combination of the non-diagonal Mueller matrix elements.

Figure 3:
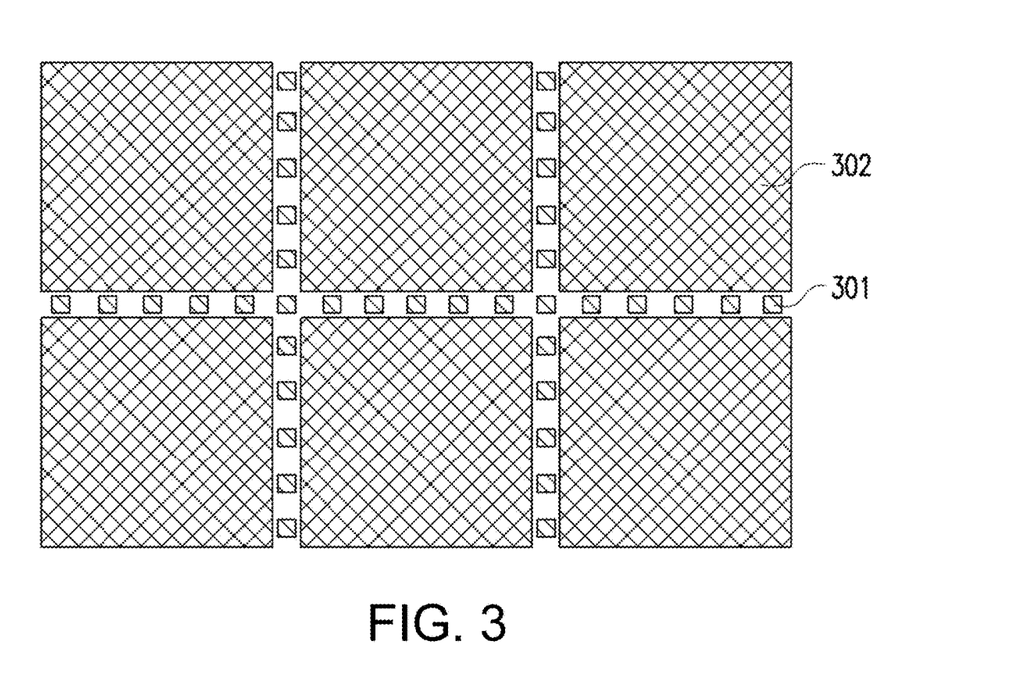
FIG. 3 schematically shows the device area and the position of the overlay mark in the scribe groove embodied in the embodiment.

When the eDBO method is used for overlay error processing, the measurement object is the overlay mark 301 (as shown in FIG. 3) on the scribe groove area on the overlay sample to be tested. Under the circumstances, formulas (a) and (b) can be used to calculate the overlay error, two sets of overlay marks need to be measured to obtain the overlay error in one direction.

When an advanced machine learning method is used, the measurement object can be the overlay mark 301 in FIG. 3 or the periodic device 302.

Figure 4:
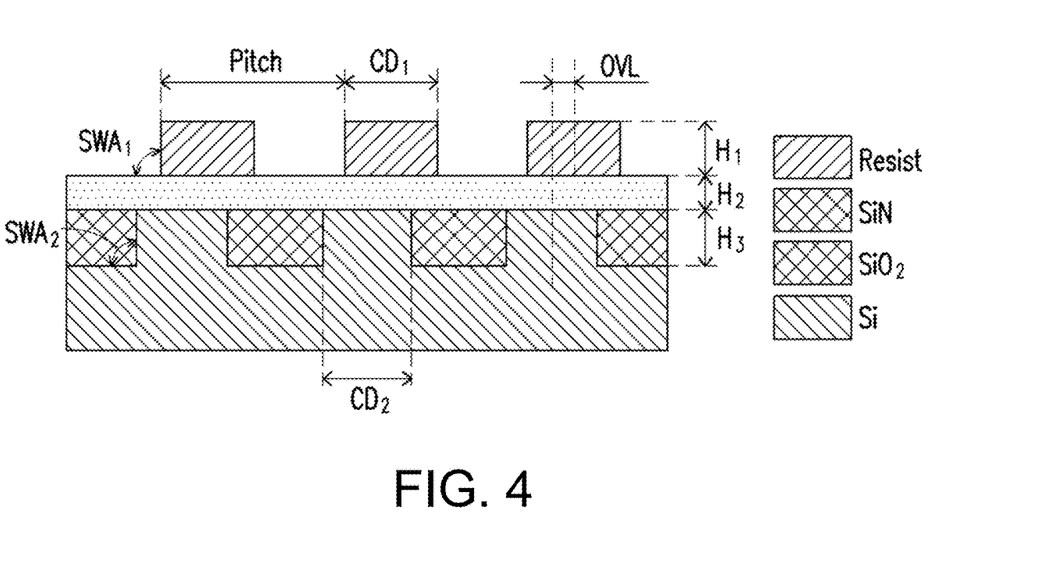
FIG. 4 schematically shows a structure diagram of the overlay sample to be tested embodied in the embodiment.

The embodiment of the disclosure will take the cross-sectional view of the overlay mark shown in FIG. 4 as an example to verify the correctness of the measuring method of the disclosure. As shown in FIG. 4, the materials of each layer from top to bottom are Resist, SiN, $SiO_2$, and Si in sequence. The period of the overlay grating mark is Pitch=600 nm, the upper grating mark line width $CD_1$=200 nm, the height $H_1$=100 nm, the side wall angle $SWA_1$=87°, the lower grating mark line width $CD_2$=180 nm, the height $H_3$=300 nm, the side wall angle $SWA_2$=87°, the thickness of the middle layer SiN $H_2$=13 nm, and the overlay error OVL of the upper and lower grating marks=20 nm. Rigorous coupled wave analysis is used for the calculation of the overlay mark Mueller matrix shown in FIG. 4. In calculation, the incident angle and azimuth are set to 65° and 90° respectively, and the wavelength range $\lambda$=450-750 nm.

The specific verification process is as follows: First, the RCWA method is used to calculate the Mueller matrix of the overlay mark, which is indicated as $M_S^{RCWA}$; then, the Mueller matrix $M_S$ of the sample to be tested in the system model shown in formula (1) is replaced with the Mueller matrix $M_S^{RCWA}$ of the overlay mark calculated by using RCWA method. Secondly, the formula (1) is expanded to obtain the formula (7), Fourier transform is performed on the formula (7), and then low-pass filtering is applied to the carrier frequency channels $f_{\pm 1}$ and $f_{\pm 2}$, and the Mueller matrix of the sample to be tested recurred in this process is indicated as $M_S^{Model}$. Finally, $M_S^{RCWA}$ and $M_S^{Model}$ are compared to verify the correctness of the measuring method provided in the disclosure. In the verification process, the first phase retarder and the second phase retarder in the measuring device shown in FIG. 1 adopt the multi-order waveplates made of $MgF_2$ material, and the thickness of the two multi-order waveplates is t=1.6694 mm.

Figure 5A:
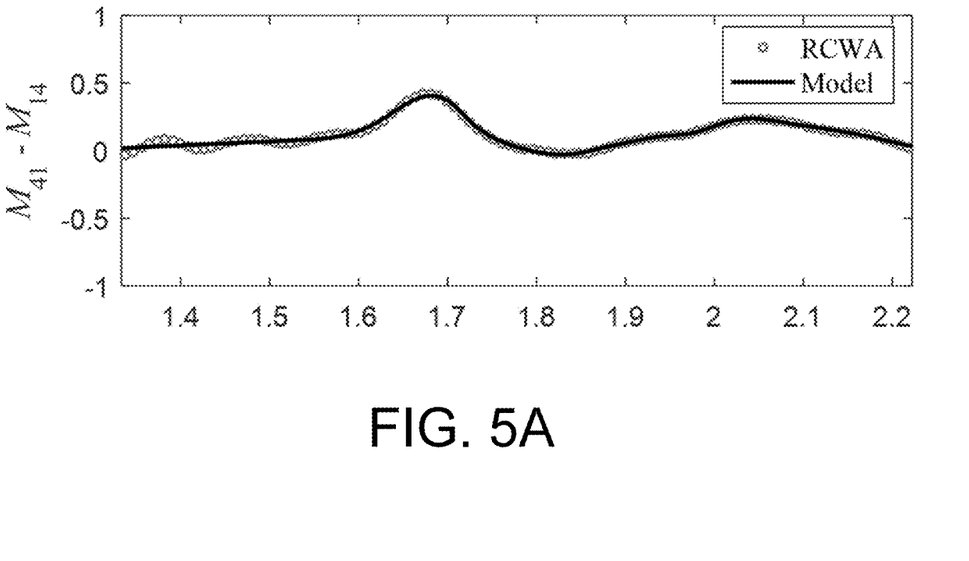
FIG. 5A schematically shows the measurement result of Mueller matrix element combination $M_{41}$–$M_{14}$ of the overlay mark that is calculated according to rigorous coupled wave analysis (RCWA).
Figure 5B:
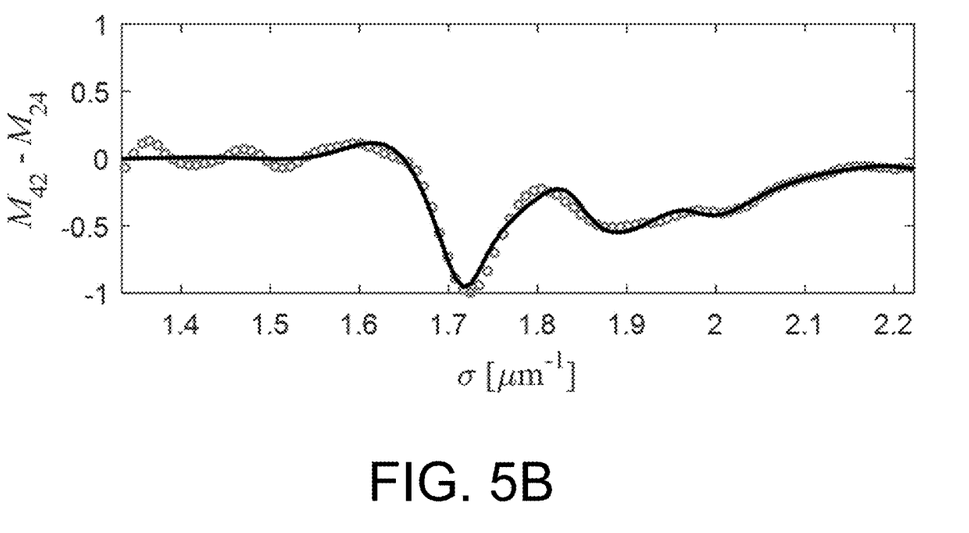
FIG. 5B schematically shows the measurement result of Mueller matrix element combination $M_{42}$–$M_{24}$ of the overlay mark that is calculated according to RCWA.

FIG. 5A and FIG. 5B are the comparison between the overlay mark Mueller matrix element combination $M_{41} - M_{14}$ and $M_{42} - M_{24}$ (corresponding to the circle in the figure) calculated by using RCWA method and the recurring result of the measuring method provided by the disclosure (corresponding to the straight line in the figure). In the comparison, the abscissa is the wavenumber σ (that is, the reciprocal of the wavelength L, the wavelength range is 450 to 750 nm). It can be obtained from FIG. 5A and FIG. 5B that the recurring result of the measuring method provided in the disclosure can better match the calculation result of RCWA, which can verify the correctness of the measuring method provided in the disclosure.

Another aspect of the disclosure provides a measuring device for realizing the snapshot type overlay error measuring method. The measuring device includes a PSG arm and a PSA arm. The PSG arm includes a polarizer, a first phase retarder, and a first lens group arranged in sequence along the optical path. The PSA arm and the PSG arm are arranged symmetrically along the normal line of the surface of the overlay sample to be tested. The PSA arm includes a second lens group, a second phase retarder, and an analyzer arranged in sequence along the optical path.

Figure 2:
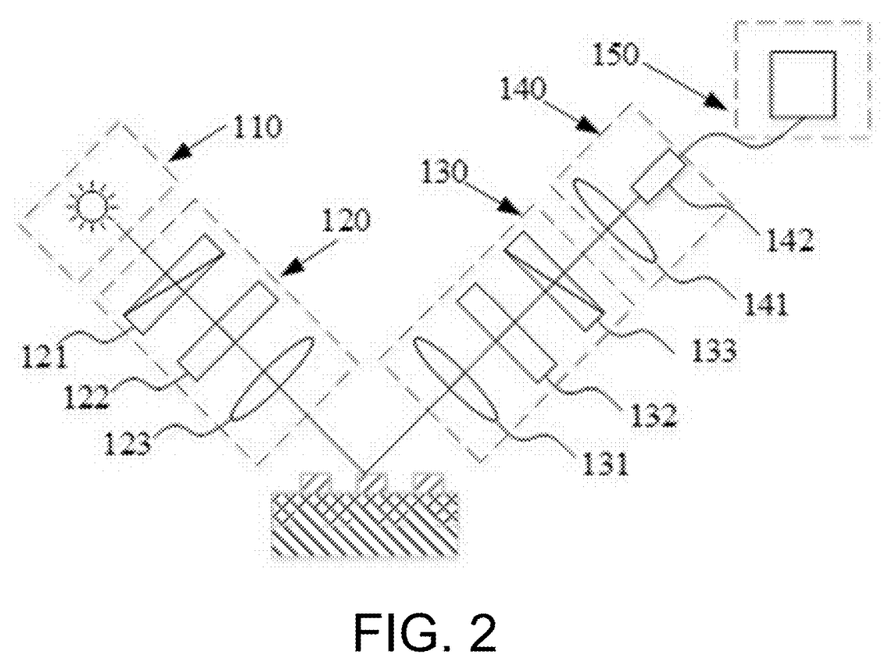
FIG. 2 schematically shows an overlay error measuring device embodied in the embodiment.

When the overlay error measuring device is used for overlay error measurement, the measuring beam is modulated by the PSG arm, and then irradiated to the measuring beam containing sample information at the reflection of the overlay sample to be tested. The PSA arm demodulates the measuring beam and is subjected to data processing by the data processing system to obtain overlay error. As shown in FIG. 2, the snapshot type overlay error measuring device of the disclosure includes an illumination system 110, a PSG arm 120, a PSA arm 130, a detection system 140 and a data processing system 150.

The illumination system 110 is used to generate detection light. In the embodiment of the disclosure, the illumination system 110 provides parallel detection light for the overall overlay error measuring device. The illumination system 110 can be a wide-spectrum light source with a certain bandwidth, or a laser light source with a frequency-scanning function. When the light beam emitted by the light source is non-collimated light, the illumination system 110 should further include a collimating lens group.

The PSG arm 120 is disposed on the optical path of the illumination system 110, and the PSG arm 120 includes a polarizer 121, a first phase retarder 122 and a first lens group 123 arranged in sequence along the optical path. The polarizer 121 converts the detection light emitted by the illumination system 110 into linearly polarized light. The first phase retarder 122 is preferably a multi-order waveplate made of birefringent crystals, and the phase retardation amount thereof is approximately linear with the wavenumber (that is, the reciprocal of the wavelength), and the two perform modulation on the linearly polarized light, so that the polarization state of the measuring beam changes periodically with the wavenumber. The first lens group 123 converges the modulated linearly polarized light to the surface of the overlay sample to be tested, so as to achieve a small detection spot.

The PSA arm 130 and the PSG arm 120 are symmetrically arranged along the normal line of the surface of the overlay sample to be tested. When the measurement incident angle needs to be changed, the PSG arm 120 and the PSA arm 130 need to be rotated simultaneously to ensure that the optical axes of the two intersect at the sample surface, and the symmetrical relationship between the two with respect to the normal line must be maintained. The PSA arm 130 includes a second lens group 131, a second phase retarder 132, and an analyzer 133 arranged in sequence along the optical path. The reflective light reflected by the surface of the overlay sample to be tested is collimated by the second lens group 131 and then demodulated by the third phase retarder 132 and the analyzer 133. The third phase retarder 132 is preferably a multi-order waveplate made of birefringent crystals, and the phase retardation amount thereof is approximately linear with the wavenumber, and the two and the analyzer 133 demodulate the reflective light containing sample information. The analyzer 133 should have a sufficient extinction ratio, for example, the extinction ratio is less than $10^{-4}$.

The thickness ratio of the first phase retarder 122 and the second phase retarder 132 is preferably 1:1 or 1:3, and a clear overlay error can be obtained under this thickness ratio.

The polarizer 121, the analyzer 133, and the phase retarder should be arranged according to the designed azimuth to complete the modulation and demodulation of the polarization state of the detection beam, and realize the measurement of the non-diagonal Mueller matrix elements. In the embodiment of the disclosure, the azimuth of light transmission axis of the polarizer 121 is 0°, the azimuth of the fast axis of the first phase retarder 122 is ±45°, the azimuth of the fast axis of the second phase retarder 132 is 0°, and the azimuth of the light transmission axis of the analyzer 133 is ∓45°; or the azimuth of the light transmission axis of the polarizer 121 is ±45°, the azimuth of the fast axis of the first phase retarder 122 is 0°, the azimuth of the fast axis of the second phase retarder 132 is ∓45°, and the azimuth of the light transmission axis of the analyzer 133 is 0°; or the azimuth of the light transmission axis of the polarizer 121 is 0°, the azimuth of the fast axis of the first phase retarder 122 is ±45°, the azimuth of the fast axis of the second phase retarder 132 is ±45°, and the azimuth of the light transmission axis angle of the analyzer 133 is 0°; or the azimuth of the light transmission axis of the polarizer 121 is ±45°, the azimuth of the fast axis of the first phase retarder 122 is 0°, the azimuth of the fast axis of the second phase retarder 132 is 0°, and the azimuth of the light transmission axis of the analyzer 133 is ±45°.

The detection system 140 is arranged on the optical path of the PSA arm 130. The detection system 140 converges the beam demodulated by the PSA arm 130 and transmits the beam to the data processing system 150. The light intensity of the beam is converted into a Mueller matrix element by the data processing system 150, and an overlay error is obtained according to the Mueller matrix element. The detection system 140 includes a third lens group 141 and a detector 142. The third lens group 141 can be a lens or a fiber collimator, and its function is to converge the detection light containing sample information to facilitate collection by the detector 142 subsequently. The detector 142 can detect and collect the measurement beam, which can be a spectrometer, etc., and should have a wavelength resolution function, and should have sufficient spectral resolution to meet the requirements of subsequent data processing. The data processing system 150 performs Fourier analysis on the measurement spectrum to obtain the frequency-domain signal of the measurement spectrum, and then performs sub-channel frequency-domain analysis on the frequency-domain signal to obtain the non-diagonal Mueller matrix elements ($M_{13}$, $M_{31}$, $M_{23}$, $M_{32}$, $M_{41}$, $M_{14}$, $M_{42}$ or $M_{24}$) of the overlay sample to be tested or the linear combination of the non-diagonal Mueller matrix elements ($M_{13}+M_{31}$, $M_{23}+M_{32}$, $M_{41}-M_{14}$ or $M_{42}-M_{24}$). The overlay error of the overlay sample to be tested can be obtained by using the eDBO method or machine learning method shown in formulas (a) to (b) according to the non-diagonal Mueller matrix elements or the linear combination thereof.

The above measuring method in this embodiment is:

In this embodiment, $S_{in}=[I_{in}, 0, 0, 0]^T$ is the Stokes vector corresponding to the incident light, $I_{in}$ is the incident light intensity, and the superscript "T" represents the matrix transposition; $M_P$ and $M_A$ are respectively the Mueller matrix corresponding to the polarizer 121 and the analyzer 133:

$$M_A = M_P = \frac{1}{2}\begin{bmatrix} 1 & 1 & 0 & 0 \\ 1 & 1 & 0 & 0 \\ 0 & 0 & 0 & 0 \\ 0 & 0 & 0 & 0 \end{bmatrix} \quad (2)$$

$M_R(\delta_1)$ and $M_R(\delta_2)$ are the Mueller matrices corresponding to the first phase retarder 122 and the second phase retarder 132, respectively:

$$M_R(\delta_i) = \begin{bmatrix} 1 & 0 & 0 & 0 \\ 0 & 1 & 0 & 0 \\ 0 & 0 & \cos\delta_i & \sin\delta_i \\ 0 & 0 & -\sin\delta_i & \cos\delta_i \end{bmatrix}, (i = 1, 2) \quad (3)$$

In the formula, $\delta_1$ and $\delta_2$ are the phase retardation amount of the first phase retarder 122 and the second phase retarder 132, respectively, and $\delta_i=2\pi B_i(\sigma)t_i\sigma$ (i=1, 2), where $B_i(\sigma)$ and $t_i$ are the birefringence and thickness of the multi-order waveplate, respectively, and $\sigma$ is the wavenumber (that is, the reciprocal of the wavelength $\lambda$).

$M_S$ is the Mueller matrix corresponding to the sample to be tested:

$$M_S = \begin{bmatrix} M_{11} & M_{12} & M_{13} & M_{14} \\ M_{21} & M_{22} & M_{23} & M_{24} \\ M_{31} & M_{32} & M_{33} & M_{34} \\ M_{41} & M_{42} & M_{43} & M_{44} \end{bmatrix} \quad (4)$$

$R(\gamma)$ represents the Mueller rotation matrix with the rotation angle $\gamma$:

$$R(\gamma) = \begin{bmatrix} 1 & 0 & 0 & 0 \\ 0 & \cos 2\alpha & -\sin 2\alpha & 0 \\ 0 & \sin 2\alpha & \cos 2\alpha & 0 \\ 0 & 0 & 0 & 1 \end{bmatrix} \quad (5)$$

In the formula, $\gamma=\alpha_1, \alpha_2, \beta_1, \beta_2$; and $\alpha_1$ and $\alpha_2$ correspond to the azimuth of the light transmission axis of the polarizer 121 and the analyzer 133, respectively, and $\beta_1$ and $\beta_2$ respectively represent the azimuth of the fast axis of the first phase retarder 122 and the second phase retarder 132.

Take the following as an example, in which the azimuth of the light transmission axis of the polarizer 121 is 0°, the azimuth of the fast axis of the first phase retarder 122 is 45°, the azimuth of the fast axis of the second phase retarder 132 is 45°, and the azimuth of the light transmission axis of the analyzer 133 is 0°, that is: $\alpha_1=\alpha_2=0°$, $\beta_1=\beta_2=45°$. If the first phase retarder 122 and the second phase retarder 132 adopt a multi-order waveplate made of the same birefringent crystal material (i.e., $B_1(\sigma)=B_2(\sigma)$, abbreviated as $B(\sigma)$), and the two multi-order waveplates have the same thickness (that is, $t_1=t_2$, abbreviated as t), then the phase retardation amount of the two multi-order waveplates subjected to phase retardation is $\delta_1=\delta_2$. For convenience, the phase retardation amount of the first phase retarder 122 and the second phase retarder 132 is indicated as $\delta=2\pi B(\sigma)t\sigma$. Formulas (2) to (3) are substituted into formula (1), by expanding the formula, the light intensity $I_{out}$ corresponding to the emitted light beam (that is, the first element of the emitted light corresponding to the Stokes vector $S_{out}$) can be obtained:

$$I_{out}=\tfrac{1}{4}I_{in}[M_{11}+\tfrac{1}{2}(M_{22}-M_{44})+(M_{41}-M_{14})\sin\delta+(M_{12}+M_{21})\cos\delta \; \tfrac{1}{2}(M_{42}-M_{24})\sin 2\delta+(M_{22}+M_{44})\cos 2\delta] \quad (6)$$

By using Euler's formula, formula (6) can be transformed into:

$$I_{out}=\tfrac{1}{4}I_{in}\{M_{11}+(M_{22}-M_{44})+\tfrac{1}{2}[(M_{12}+M_{21})-i(M_{41}-M_{14})]e^{i\delta}\tfrac{1}{2}[(M_{12}+M_{21})+i(M_{41}-M_{14})]e^{-i\delta}+ \tfrac{1}{4}[(M_{22}+M_{44})-i(M_{42}-M_{24})]e^{i2\delta}\tfrac{1}{4}[(M_{22}+M_{44})+i(M_{42}-M_{24})]e^{-i2\delta}\} \quad (7)$$

It should be pointed out that in formulas (6) and (7), $I_{in}$ and $M_{ij}$ (i, j=1, 2, 3, 4) are functions of wavenumber $\sigma$. Based on formula (7), it can be obtained that the quantities to be measured, $M_{41}-M_{14}$ and $M_{42}-M_{24}$, are modulated into the carrier frequency channels $f_{\pm 1}=\pm B(\sigma)t$ and $f_{\pm 2}=\pm 2B(\sigma)t$ respectively. By performing Fourier transform on formula (7), and then applying band-pass filtering on the above-mentioned carrier frequency channel, the quantities to be measured can be obtained.

To sum up, the overlay error measuring device and measuring method designed in this disclosure can quickly obtain the Mueller matrix of the overlay sample to be tested without involving the moving device, and performs overlay error measurement based on incident light and zero-order diffracted light. In this manner, the overlay mark cycle is not restricted, the measurement speed is fast, and the measurement result is not affected by the moving device's interference on the measurement signal. The disclosure can be applied to both the overlay error measurement based on the overlay mark in the scribe groove area and the overlay error measurement based on the device itself.

Those skilled in the art can easily understand that the above are only preferred embodiments of the disclosure and are not intended to limit the disclosure. Any modification, equivalent replacement and improvement, etc., made within the spirit and principle of the disclosure should all be included in the scope to be protected by the disclosure.

What is claimed is:

1. A snapshot type overlay error measuring method, the method comprising:

S1: a detection light being subjected to a polarizer and a first phase retarder in sequence and converging on a surface of an overlay sample to be measured to obtain a zero-order diffracted light, and then the zero-order diffracted light being subjected to a second phase retarder and an analyzer in sequence to obtain a measurement spectrum;

S2, Fourier analysis being performed on the measurement spectrum to obtain a frequency-domain signal of the measurement spectrum, and a sub-channel frequency-domain analysis being performed on the frequency-domain signal to obtain a linear combination of non-diagonal Mueller matrix elements of the overlay sample to be tested, wherein the following system model is used to obtain the non-diagonal Mueller matrix elements of the overlay sample to be tested:

$$S_{out}=[M_A R(\alpha_2)]\cdot[R(-\beta_2)M_R(\delta_2)R(\beta_2)]\cdot M_S \cdot [R(-\beta_1)M_R(\delta_1)R(\beta_1)]\cdot[R(-\alpha_1)M_P]\cdot S_{in}$$

wherein $S_{out}$ is a Stokes vector corresponding to an emitted light, $M_A$ is a Mueller matrix corresponding to the analyzer, $M_P$ is a Mueller matrix corresponding to the polarizer, $R(*)$ represents a Mueller rotation matrix when a rotation angle is $*$, $\alpha_1$ is an azimuth of a light transmission axis for the polarizer, $\alpha_2$ is the azimuth of the light transmission axis for the analyzer; $\beta_1$ is an azimuth of a fast axis during a first phase retarder, and $\beta_2$ is the azimuth of the fast axis during a second phase retarder, $M_R(\delta_1)$ is a Mueller matrix corresponding to the first phase retarder, $M_R(\delta_2)$ is a Mueller matrix corresponding to the second phase retarder, $M_S$ is a Mueller matrix corresponding to the sample under test, and $S_{in}$ is the Stokes vector corresponding to an incident light;

S3, the linear combination of the non-diagonal Mueller matrix elements being processed to obtain an overlay error of the overlay sample under test.

2. The measuring method according to claim 1, wherein the azimuth of the light transmission axis during the polarizer is 0°, the azimuth of the fast axis during the first phase retarder is ±45°, the azimuth of the fast axis during the second phase retarder is 0°, and the azimuth of the light transmission axis during the analyzer is ∓45°;

or the azimuth of the light transmission axis during the polarizer is ±45°, the azimuth of the fast axis during the first phase retarder is 0°, the azimuth of the fast axis during the second phase retarder is ∓45°, and the azimuth of the light transmission axis during the analyzer is 0°;

or the azimuth of the light transmission axis during the polarizer is 0°, the azimuth of the fast axis during the first phase retarder is ±45°, the azimuth of the fast axis during the second phase retarder is ±45°, and the azimuth of the light transmission axis during the analyzer is 0°;

or the azimuth of the light transmission axis during the polarizer is ±45°, the azimuth of the fast axis during the first phase retarder is 0°, the azimuth of the fast axis during the second phase retarder is 0°, and the azimuth of the light transmission axis during the analyzer is ±45°.

3. The measuring method according to claim 1, wherein in step S3, the non-diagonal Mueller matrix elements are processed by an empirical diffraction-based overlay (eDBO) method or a machine learning method to obtain the overlay error of the overlay sample under test.

4. A measuring device for realizing the snapshot type overlay error measuring method as claimed in claim 1, wherein the measuring device comprises a polarization state generator (PSG) arm and a polarization state analyzer (PSA) arm, the PSG arm comprises the polarizer, the first phase retarder, and a first lens group arranged in sequence along an optical path, the PSA arm and the PSG arm are arranged symmetrically along a normal line of the surface of the overlay sample to be tested, the PSA arm comprises a second lens group, the second phase retarder and the analyzer arranged in sequence along the optical path.

5. The measuring device according to claim 4, wherein the azimuth of the light transmission axis of the polarizer is 0°, the azimuth of the fast axis of the first phase retarder is ±45°, the azimuth of the fast axis of the second phase retarder is 0°, and the azimuth of the light transmission axis of the analyzer is ∓45°;

or the azimuth of the light transmission axis of the polarizer is ±45°, the azimuth of the fast axis of the first phase retarder is 0°, the azimuth of the fast axis of the second phase retarder is ∓45°, and the azimuth of the light transmission axis of the analyzer is 0°;

or the azimuth of the light transmission axis of the polarizer is 0°, the azimuth of the fast axis of the first phase retarder is ±45°, the azimuth of the fast axis of the second phase retarder is ±45°, and the azimuth of the light transmission axis of the analyzer is 0°;

or the azimuth of the light transmission axis of the polarizer is ±45°, the azimuth of the fast axis of the first phase retarder is 0°, the azimuth of the fast axis of the second phase retarder is 0°, and the azimuth of the light transmission axis of the analyzer is ±45°.

6. The measuring device according to claim 4, wherein the device further comprises a detection system and a data processing system, wherein the detection system is arranged on an optical path of the PSA arm, and the detection system converges a beam demodulated by the analyzer arm and transmits the beam to the data processing system, the data processing system converts a light intensity of the beam into the Mueller matrix elements, and obtains the overlay error according to the Mueller matrix elements.

7. The measuring device according to claim 4, wherein a thickness ratio of the first phase retarder and the second phase retarder is 1:1 or 1:3.

8. The measuring device according to claim 4, wherein the first phase retarder and the second phase retarder are multi-order waveplates made of birefringent crystals.

9. A measuring device for realizing the snapshot type overlay error measuring method as claimed in claim 2, wherein the measuring device comprises a polarization state generator (PSG) arm and a polarization state analyzer (PSA) arm, the PSG arm comprises the polarizer, the first phase retarder, and a first lens group arranged in sequence along an optical path, the PSA arm and the PSG arm are arranged symmetrically along a normal line of the surface of the overlay sample to be tested, the PSA arm comprises a second lens group, the second phase retarder and the analyzer arranged in sequence along the optical path.

10. A measuring device for realizing the snapshot type overlay error measuring method as claimed in claim 3, wherein the measuring device comprises a polarization state generator (PSG) arm and a polarization state analyzer (PSA) arm, the PSG arm comprises the polarizer, the first phase retarder, and a first lens group arranged in sequence along an optical path, the PSA arm and the PSG arm are arranged symmetrically along a normal line of the surface of the overlay sample to be tested, the PSA arm comprises a second lens group, the second phase retarder and the analyzer arranged in sequence along the optical path.

* * * * *